(12) United States Patent
Huang et al.

(10) Patent No.: US 12,080,590 B2
(45) Date of Patent: Sep. 3, 2024

(54) MANUFACTURING METHOD OF INTERCONNECT STRUCTURE

(71) Applicant: Powerchip Semiconductor Manufacturing Corporation, Hsinchu (TW)

(72) Inventors: Hung-Yao Huang, Hsinchu County (TW); Shyng-Yeuan Che, Hsinchu County (TW); Ching-Hsiu Wu, Hsinchu (TW)

(73) Assignee: Powerchip Semiconductor Manufacturing Corporation, Hsinchu (TW)

(*) Notice: Subject to any disclaimer, the term of this patent is extended or adjusted under 35 U.S.C. 154(b) by 465 days.

(21) Appl. No.: 17/584,385

(22) Filed: Jan. 26, 2022

(65) Prior Publication Data
US 2023/0187272 A1 Jun. 15, 2023

(30) Foreign Application Priority Data

Dec. 10, 2021 (TW) ................... 110146200

(51) Int. Cl.
*H01L 21/768* (2006.01)
(52) U.S. Cl.
CPC .... *H01L 21/7682* (2013.01); *H01L 21/76804* (2013.01); *H01L 21/76843* (2013.01); *H01L 21/76883* (2013.01)

(58) Field of Classification Search
CPC .......... H01L 21/7682; H01L 21/76804; H01L 21/76843; H01L 21/76883
See application file for complete search history.

(56) References Cited

U.S. PATENT DOCUMENTS

2016/0111326 A1 4/2016 Ohori et al.
2021/0272841 A1* 9/2021 Lin .................... H01L 23/5226

FOREIGN PATENT DOCUMENTS

CN 101399222 9/2010

OTHER PUBLICATIONS

"Office Action of Taiwan Counterpart Application", issued on Apr. 29, 2022, p. 1-p. 6.

* cited by examiner

*Primary Examiner* — Samuel A Gebremariam
(74) *Attorney, Agent, or Firm* — JCIPRNET

(57) ABSTRACT

A manufacturing method of an interconnect structure including the following is provided. A substrate is provided. Sacrificial layers are formed on the substrate. A dielectric layer is formed between two adjacent sacrificial layers. There is an air gap in the dielectric layer. The sacrificial layers are removed to form first openings. A conductive layer is formed in the first opening.

10 Claims, 11 Drawing Sheets

MANUFACTURING METHOD OF INTERCONNECT STRUCTURE

CROSS-REFERENCE TO RELATED APPLICATION

This application claims the priority benefit of Taiwan application serial no. 110146200, filed on Dec. 10, 2021. The entirety of the above-mentioned patent application is hereby incorporated by reference herein and made a part of this specification.

BACKGROUND

Technical Field

The disclosure relates to a manufacturing method of a semiconductor structure, specifically to a manufacturing method of an interconnect structure.

Description of Related Art

As the integration degree of semiconductor devices keeps elevating, the gap between conductive layers has also shrunken; as a result, the parasitic capacitance between conductive layers is increased, therefore aggravating the resistance-capacitance (RC) delay. Since the resistance-capacitance delay can decrease the speed of signal transfer, how to effectively reduce the resistance-capacitance delay is the goal of our continuous efforts.

SUMMARY

The disclosure provides a manufacturing method of an interconnect structure that effectively lowers the resistance-capacitance delay.

A manufacturing method of an interconnect structure including the following is provided. A substrate is provided. Sacrificial layers are formed on the substrate. A dielectric layer is formed between two adjacent sacrificial layers. There is an air gap in the dielectric layer. The sacrificial layers are removed to form first openings. A conductive layer is formed in the first opening.

According to an embodiment of the disclosure, in the manufacturing method of an interconnect structure, the formation of the sacrificial layers includes the following. A sacrificial material layer is formed on the substrate. A hard mask material layer is formed on the sacrificial material layer. The hard mask material layer and the sacrificial material layer are patterned to form multiple hard mask layers and multiple sacrificial layers, and a second opening is formed between two adjacent hard mask layers and between two adjacent sacrificial layers.

According to an embodiment of the disclosure, the manufacturing method of an interconnect structure further includes the following. An isotropic etching process is performed on the sacrificial layers to increase a width of the second opening between two adjacent sacrificial layers.

According to an embodiment of the disclosure, in the manufacturing method of an interconnect structure, the width of the second opening between two adjacent sacrificial layers is greater than a width of the second opening between two adjacent hard mask layers.

According to an embodiment of the disclosure, in the manufacturing method of an interconnect structure, the formation of the dielectric layer includes the following. A dielectric material layer is formed in the second opening. The dielectric material layer has an air gap, and the air gap is located between two adjacent sacrificial layers. A portion of the dielectric material layer and the hard mask layers are removed, using the plurality of sacrificial layers as a stop layer, to form the dielectric layer.

According to an embodiment of the disclosure, in the manufacturing method of an interconnect structure, the material of the conductive layer is, for example, copper.

According to an embodiment of the disclosure, the manufacturing method of an interconnect structure further includes the following. A stop layer is formed on the substrate prior to forming the plurality of sacrificial layers. The dielectric layer is formed on the stop layer. A spacer wall material layer is conformally formed on the dielectric layer and the stop layer. An etch back process is performed on the spacer wall material layer to form a spacer wall on a side wall of the dielectric layer. The etch back process removes a portion of the stop layer exposed by the spacer wall to expose a portion of the substrate.

According to an embodiment of the disclosure, the manufacturing method of an interconnect structure further includes the following. A barrier layer is formed in the plurality of first openings. The barrier layer is located between the conductive layer and the dielectric layer, and between the conductive layer and the substrate.

According to an embodiment of the disclosure, in the manufacturing method of an interconnect structure, the formation of the conductive layer and the barrier layer includes the following. A barrier material layer is conformally formed in the plurality of first openings. A conductive material layer that fills in the plurality of first openings is formed on the barrier material layer. The conductive material layer and the barrier material layer on an exterior of the first openings are removed to form the conductive layer and the barrier layer.

According to an embodiment of the disclosure, in the manufacturing method of an interconnect structure, the conductive material layer and the barrier material layer on the exterior of the first openings is removed by, for example, a chemical mechanical polishing process.

Based on the aforementioned embodiments, in the manufacturing method of the interconnect structure provided in the disclosure, since the dielectric layer has air gaps, and the air gaps have lower dielectric constants, the parasitic capacitance between conductive layers is reduced, thereby effectively lowering the resistance-capacitance delay.

In order to make the aforementioned easy to understand, the following embodiments are described in detail in conjunction with the accompanying drawings.

DETAILED DESCRIPTION OF DISCLOSED EMBODIMENTS

FIG. 1A to FIG. 1K are cross-sectional views of the manufacturing process of an interconnect structure, according to an embodiment of the disclosure.

Figure 1A:
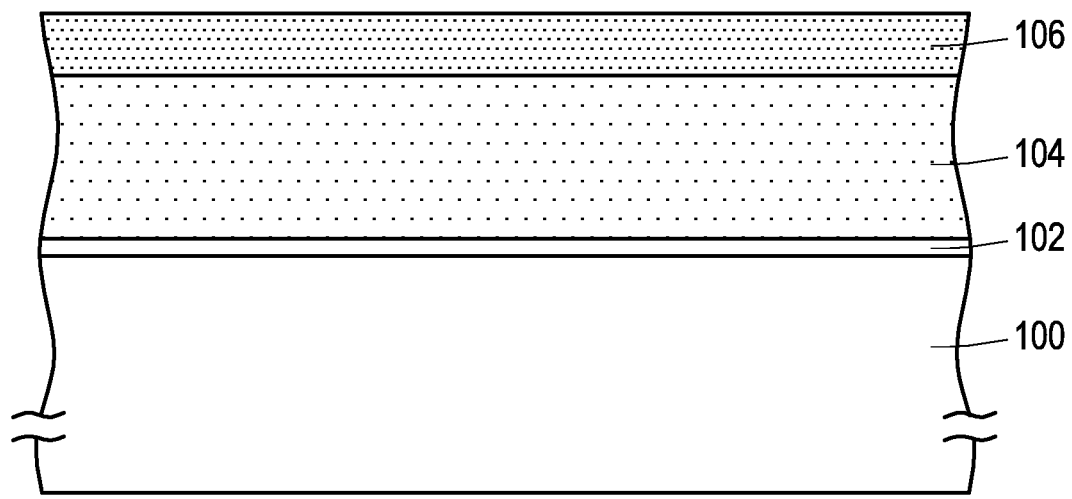
FIG. 1A to FIG. 1K are cross-sectional views of the manufacturing process of an interconnect structure, according to an embodiment of the disclosure.

Referring to FIG. 1A, a substrate 100 is provided. The substrate 100 can be a semiconductor substrate, such as a silicon substrate. Additionally, although not shown in FIG. 1A, required components such as doped regions and/or isolation structures can be included in the substrate 100.

Required components such as semiconductor elements (such as active elements like transistors, etc.), dielectric layers, and/or interconnect structure may be provided on the substrate 100, and their descriptions are herein omitted.

Then, a stop layer 102 is formed on the substrate 100. The material of the stop layer 102 is, for example, silicon oxide. The stop layer 102 is formed by, for example, a Chemical Vapor Deposition (CVD) process.

Then, a sacrificial material layer 104 is formed on the substrate 100. In this embodiment, the sacrificial material layer 104 is formed on the stop layer 102. The material of the sacrificial material layer 104 is, for example, silicon nitride. The sacrificial material layer 104 is formed by, for example, a CVD process.

Then, a hard mask material layer 106 is formed on the sacrificial material layer 104. The material of the hard mask material layer 106 is, for example, silicon oxide, such as tetraethyl orthosilicate (TEOS) silicon oxide, but the disclosure is not limited thereto. The hard mask material layer 106 is formed by, for example, a CVD process.

Figure 1B:
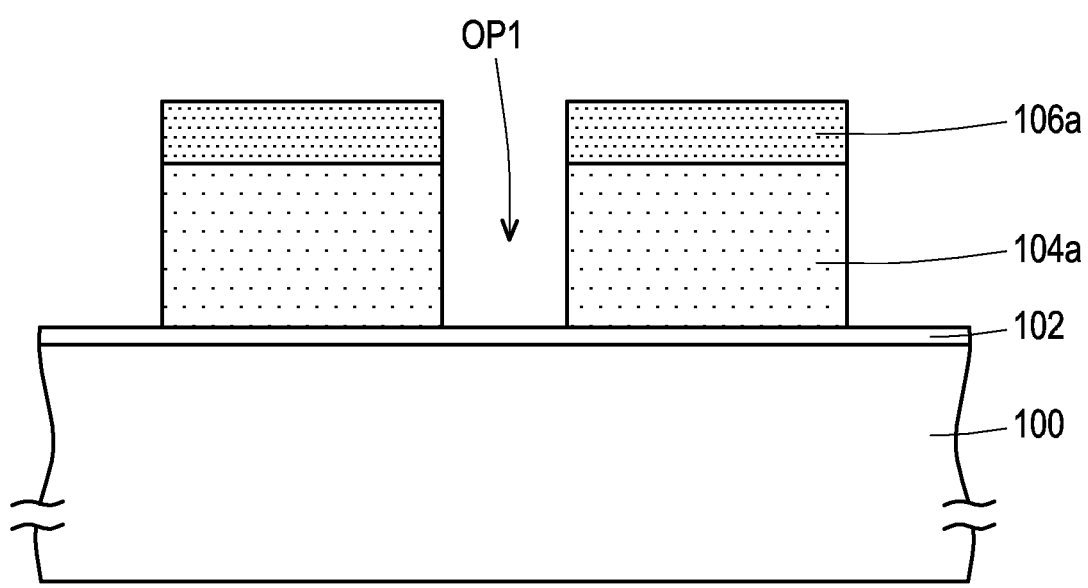

Referring to FIG. 1B, the hard mask material layer 106 and the sacrificial material layer 104 are patterned to form multiple hard mask layers 106a and multiple sacrificial layers 104a, and form an opening OP1 between two adjacent hard mask layers 106a and between two adjacent sacrificial layers 104a. Thereby, multiple sacrificial layers 104a are formed on the substrate 100. In the present embodiment, the sacrificial layer 104a is formed on the stop layer 102. Additionally, the hard mask layer 106a is formed on the sacrificial layer 104a. For example, the hard mask material layer 106 and the sacrificial material layer 104 can be patterned by lithography and etching processes, such as a dry etching process.

Figure 1C:
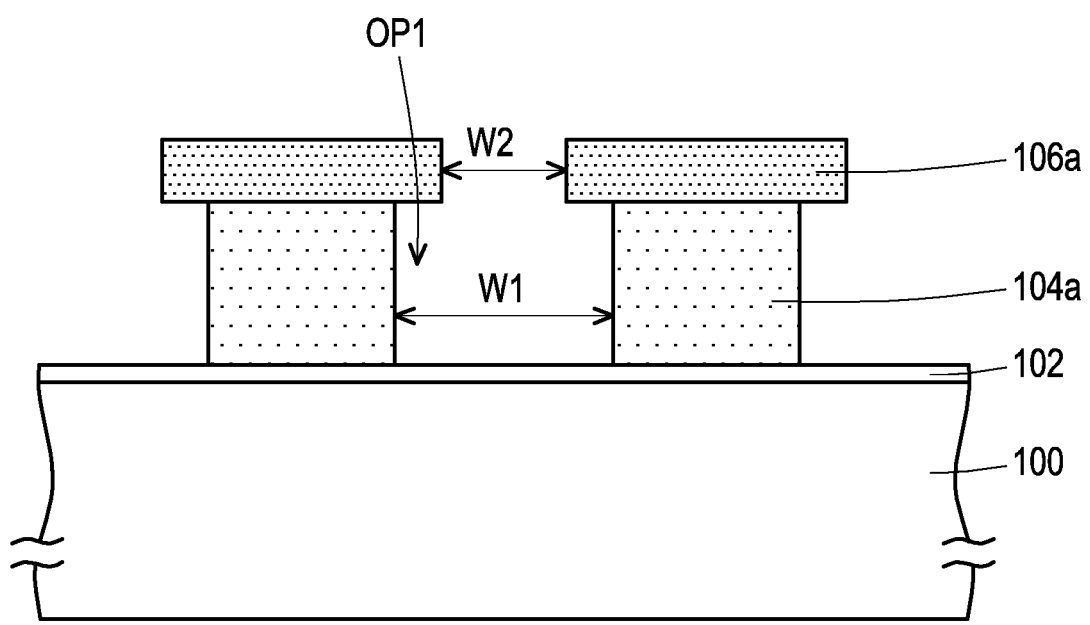

Referring to FIG. 1C, an isotropic etching process may be performed on the sacrificial layer 104a to increase the width of the opening OP1 between the two adjacent sacrificial layers 104a. The isotropic etching process is, for example, a wet etching process or a dry etching process. In some embodiments, a width W1 of the opening OP1 between two adjacent sacrificial layers 104a can be greater than a width W2 of the opening OP1 between two adjacent hard mask layers 106a.

Figure 1D:
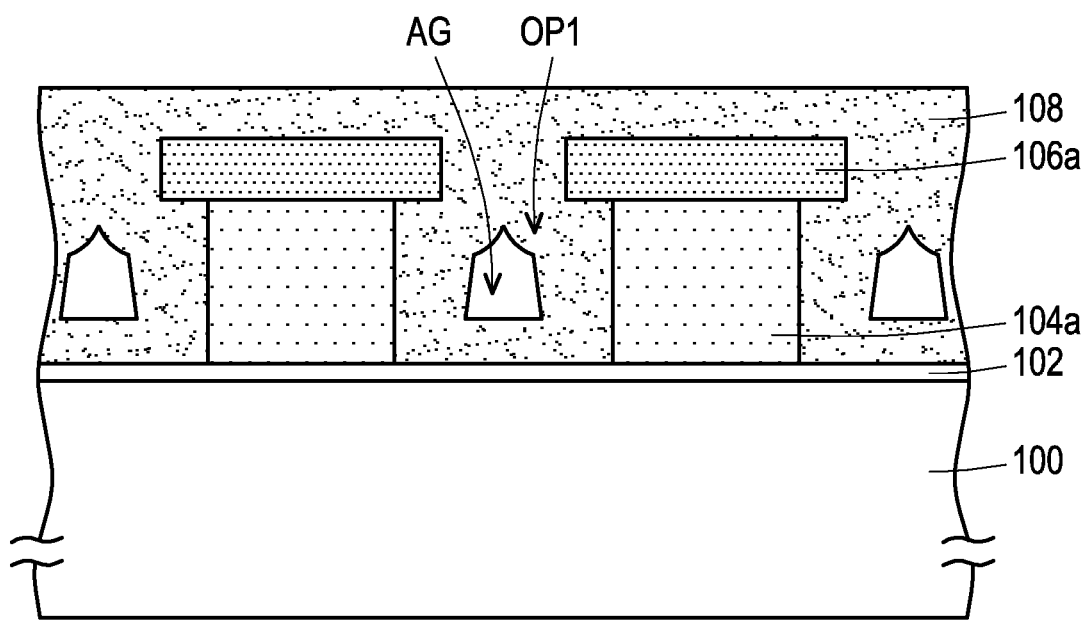

Referring to FIG. 1D, a dielectric material layer 108 is formed in the opening OP1. The dielectric material layer 108 has an air gap AG. The air gap AG is located between two adjacent sacrificial layers 104a. The material of the dielectric material layer 108 is, for example, silicon oxide (e.g., TEOS silicon oxide) or a low dielectric constant (lol-k) material. The dielectric material layer 108 is formed by, for example, a CVD process.

Figure 1E:
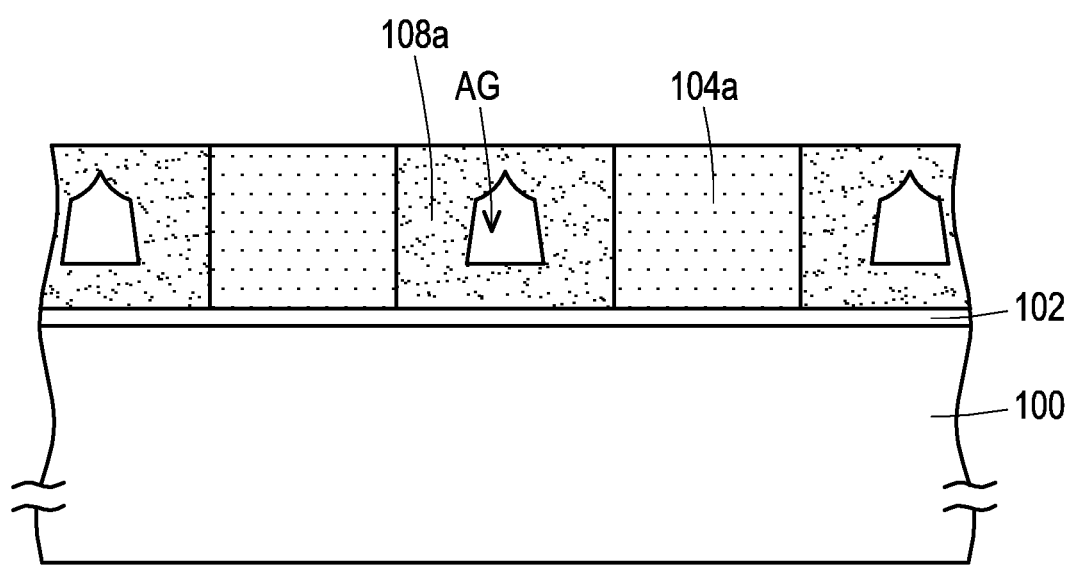

Referring to FIG. 1E, using the sacrificial layer 104a as a stop layer, a portion of the dielectric material layer 108 and the hard mask layer 106a are removed to form a dielectric layer 108a. Due to the aforementioned, the dielectric layer 108a is formed between two adjacent sacrificial layers 104a. In some embodiments, the dielectric layer 108a can be formed on the stop layer 102. The dielectric layer 108a has the air gap AG. In some embodiments, the air gap AG is in the dielectric layer 108a. That is, the air gap AG can be surrounded by the dielectric layer 108a. For example, using the sacrificial layer 104a as a polish stop layer, the dielectric material layer 108 and the hard mask layer 106a can undergo a chemical mechanical polishing (CMP) process to remove a portion of the dielectric material layer 108 and the hard mask layer 106a, thereby forming the dielectric layer 108a.

Figure 1F:
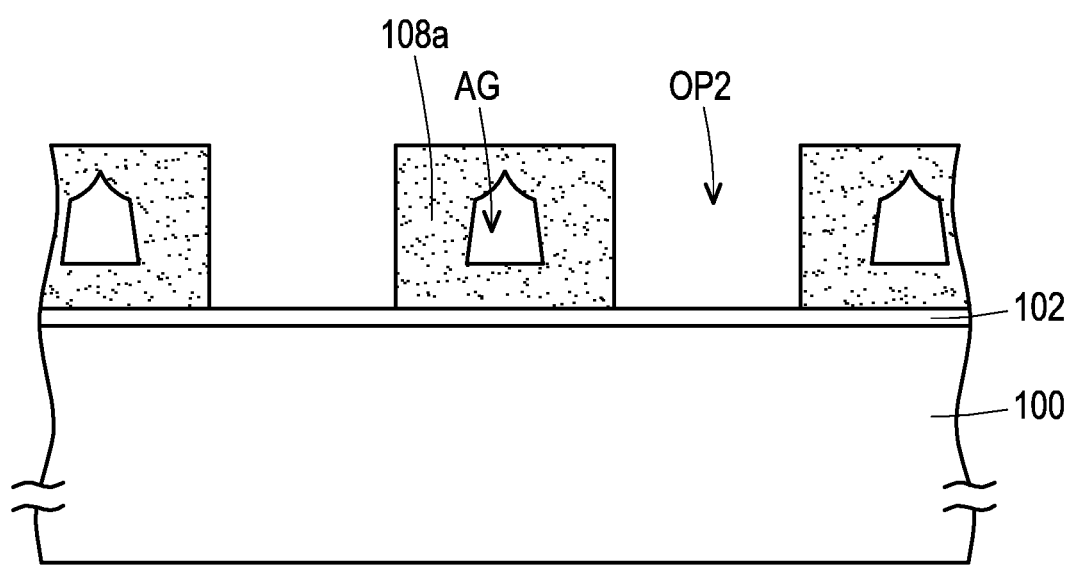

Referring to FIG. 1F, multiple sacrificial layers 104a are removed to form multiple openings OP2. The sacrificial layer 104a is removed by, for example, a wet etching process. Additionally, in the etching process for removing the sacrificial layer 104a, the stop layer 102 can be used to protect the components (such as interconnect structures or electrodes) (not shown) under the stop layer 102.

Figure 1G:
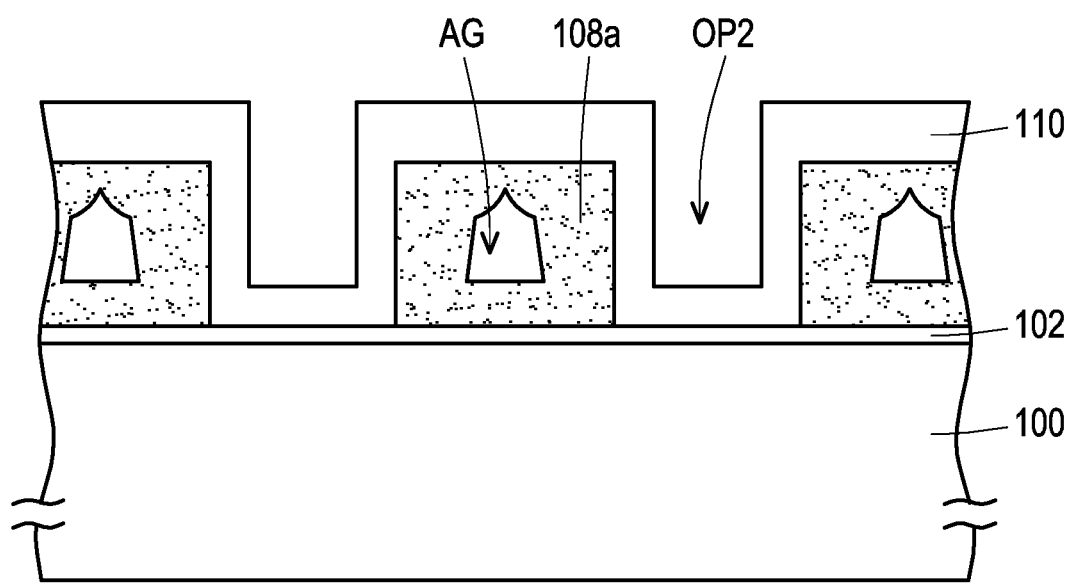

Referring to FIG. 1G, a spacer wall material layer 110 is conformally formed on the dielectric layer 108a and the stop layer 102. The material of the spacer wall material layer 110 is a material that has a high etching selectivity ratio with the dielectric layer 108a. For example, the material of the dielectric layer 108a can be TEOS silicon oxide, and the material of the spacer wall material layer 110 can be silicon nitride. The spacer wall material layer 110 is formed by, for example, a CVD process.

Figure 1H:
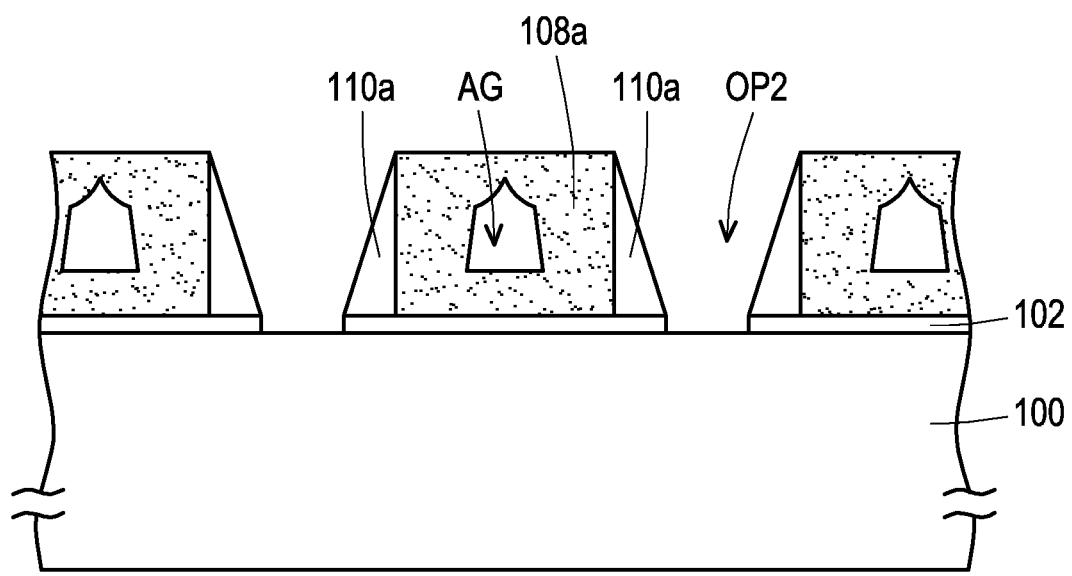

Referring to FIG. 1H, a spacer wall 110a is formed on a side wall of the dielectric layer 108a by performing an etch back process on the spacer wall material layer 110. Additionally, the aforementioned etch back process removes a portion of the stop layer 102 exposed by the spacer wall 110a, to expose a portion of the substrate 100. Therefore, the opening OP2 extends into the stop layer 102 and exposes a portion of the substrate 100. The aforementioned etch back process is, for example, a dry etching process.

Figure 1I:
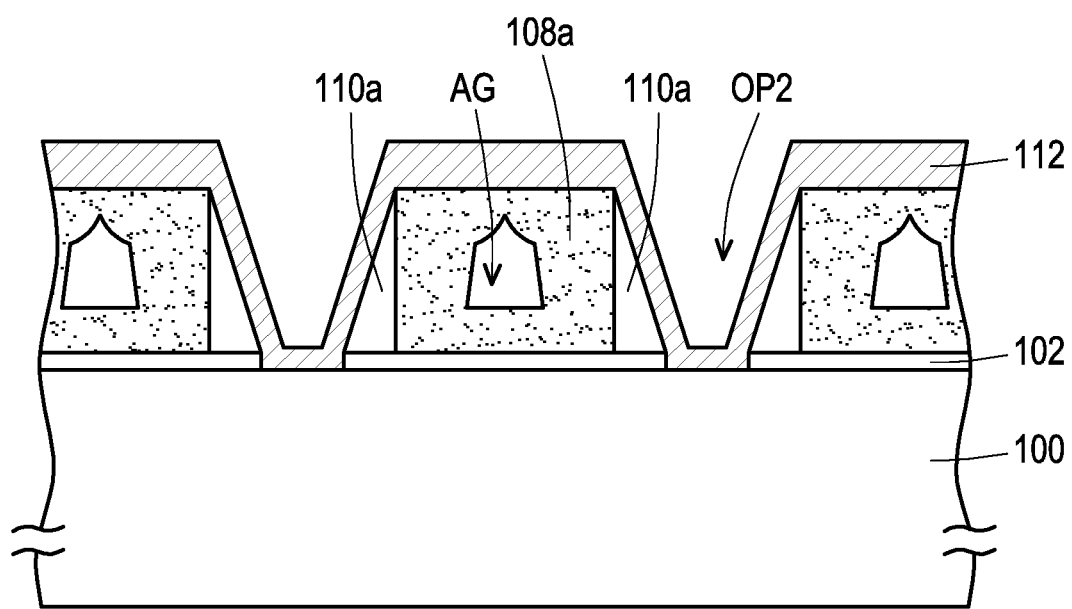

Referring to FIG. 1I, a barrier material layer 112 is conformally formed in the opening OP2. The material of the barrier material layer 112 is, for example, tantalum (Ta), tantalum nitride (TaN), or combinations thereof, but the disclosure is not limited by the aforementioned materials. The barrier material layer 112 is formed by, for example, a Physical Vapor Deposition (PVD) process, but the disclosure is not limited thereto.

Figure 1J:
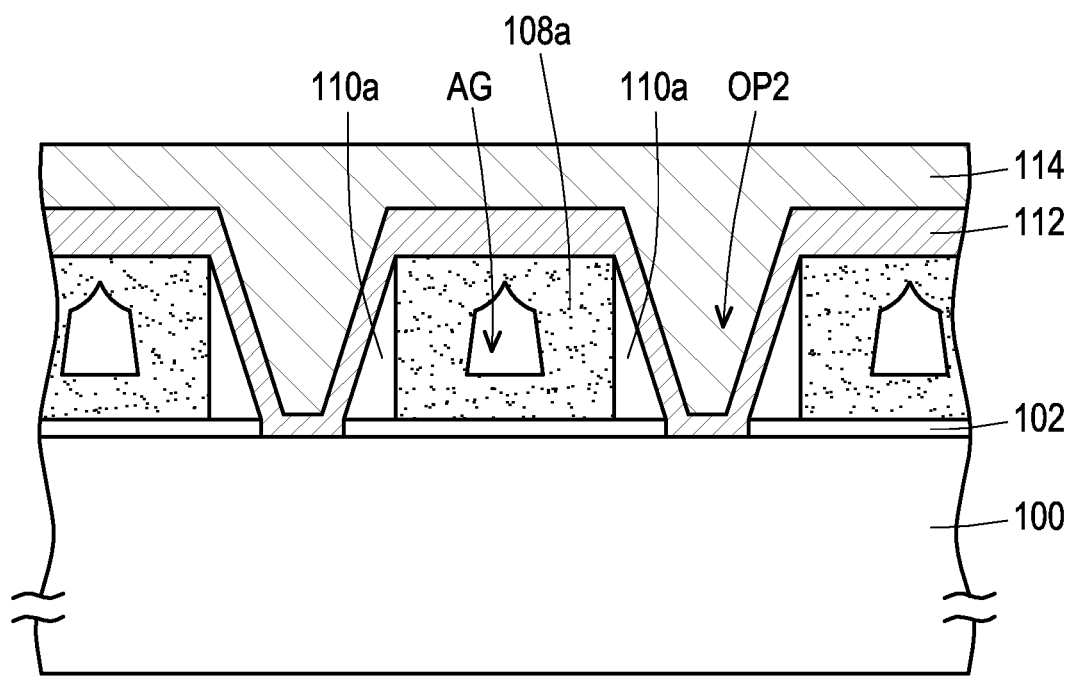

Referring to FIG. 1J, a conductive material layer 114 that fills in the opening OP2 is formed on the barrier material layer 112. The material of the conductive material layer 114 is, for example, copper. The conductive material layer 114 is formed by, for example, an electrochemical plating (ECP), PVD, or CVD process, or a combination thereof, but the disclosure is not limited by the aforementioned processes.

Figure 1K:
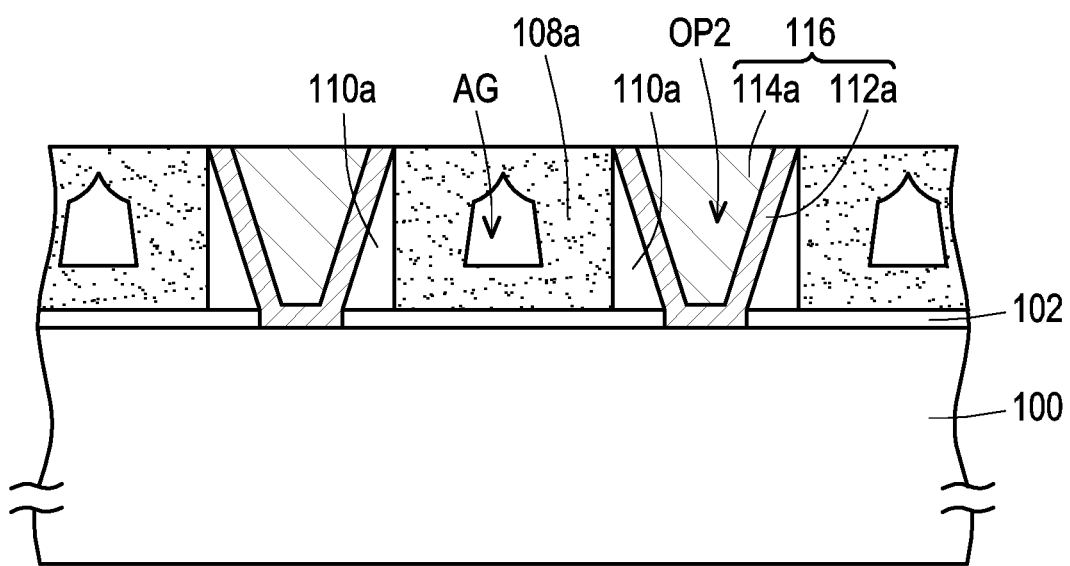

Referring to FIG. 1K, the conductive material layer 114 and the barrier material layer 112 on the exterior of the opening OP2 are removed to form a conductive layer 114a and a barrier layer 112a. Therefore, the conductive layer 114a and the barrier layer 112a are formed in the opening OP2. In some embodiments, the cross-sectional shape of the conductive layer 114a can be an inverted trapezoid. The barrier layer 112a is located between the conductive layer 114a and the dielectric layer 108a, and between the conductive layer 114a and the substrate 100. In the present embodiment, the barrier layer 112a is located between the conductive layer 114a and the spacer wall 110a. Additionally, the conductive material layer 114 and the barrier material layer 112 on the exterior of the opening OP2 are removed by, for example, a CMP process.

By using the aforementioned method (such as a damascene method), an interconnect structure 116 is formed in the opening OP2. The interconnect structure 116 can be a conductive line, a contact, or a via. The interconnect structure 116 includes the conductive layer 114a. The material of the conductive layer 114a is, for example, copper. In some embodiments, the interconnect structure 116 further includes the barrier layer 112a. The conductive layer 114a can be on the barrier layer 112a. The material of the barrier layer 112a is, for example, tantalum (Ta), tantalum nitride (TaN), or combinations thereof, but the disclosure is not limited by the aforementioned materials. In some embodiments, the interconnect structure 116 can electrically connect to conductive components (such as interconnect structures or electrodes)

(not shown) on or in the substrate 100. Additionally, when the substrate 100 has an open area (not shown), a dummy conductive pattern is simultaneously formed within the open area during the forming process of the conductive layer 114*a*. In some embodiments, the open area can be defined as a region with an area of 100 µm² or more that does not have the conductive layer 114*a*.

Based on the embodiments mentioned above, it is known that in the manufacturing method of the interconnect structure 116, since the air gap AG exists in the dielectric layer 108*a*, and the air gap AG has a lower dielectric constant, the parasitic capacitance between the conductive layers 114*a* is reduced, thereby effectively lowering resistance-capacitance delay.

To sum up, in the manufacturing method of interconnect structure of the embodiments mentioned above, since the air gap exists in the dielectric layer, the resistance-capacitance delay is effectively reduced.

Although the disclosure has been described in detail with reference to the above embodiments, they are not intended to limit the disclosure. Those skilled in the art should understand that it is possible to make changes and modifications without departing from the spirit and scope of the disclosure. Therefore, the protection scope of the disclosure shall be defined by the following claims.

What is claimed is:

1. A manufacturing method of an interconnect structure, comprising:
   providing a substrate;
   forming a plurality of sacrificial layers on the substrate;
   forming a dielectric layer between two adjacent sacrificial layers, wherein the dielectric layer has an air gap;
   removing the plurality of sacrificial layers to form a plurality of first openings; and
   forming a conductive layer in the plurality of first openings.

2. The manufacturing method according to claim 1, wherein forming the plurality of sacrificial layers comprises:
   forming a sacrificial material layer on the substrate;
   forming a hard mask material layer on the sacrificial material layer; and
   patterning the hard mask material layer and the sacrificial material layer to form a plurality of hard mask layers and the plurality of sacrificial layers, and forming a second opening between two adjacent hard mask layers and between two adjacent sacrificial layers.

3. The manufacturing method according to claim 2, further comprising:
   performing an isotropic etching process on the sacrificial layers to increase a width of the second opening between two adjacent sacrificial layers.

4. The manufacturing method according to claim 3, wherein the width of the second opening between two adjacent sacrificial layers is greater than a width of the second opening between two adjacent hard mask layers.

5. The manufacturing method according to claim 2, wherein forming the dielectric layer comprises:
   forming a dielectric material layer in the second opening, wherein the dielectric material layer has an air gap, and the air gap is located between two adjacent sacrificial layers; and
   removing a portion of the dielectric material layer and the plurality of hard mask layers, using the plurality of sacrificial layers as a stop layer, to form the dielectric layer.

6. The manufacturing method according to claim 1, wherein a material of the conductive layer comprises copper.

7. The manufacturing method according to claim 1, further comprising:
   forming a stop layer on the substrate prior to forming the plurality of sacrificial layers, wherein the dielectric layer is formed on the stop layer;
   conformally forming a spacer wall material layer on the dielectric layer and the stop layer; and
   performing an etch back process on the spacer wall material layer to form a spacer wall on a side wall of the dielectric layer, wherein the etch back process removes a portion of the stop layer exposed by the spacer wall to expose a portion of the substrate.

8. The manufacturing method according to claim 1, further comprising:
   forming a barrier layer in the plurality of first openings, wherein the barrier layer is located between the conductive layer and the dielectric layer, and between the conductive layer and the substrate.

9. The manufacturing method according to claim 8, wherein forming the conductive layer and the barrier layer comprises:
   conformally forming a barrier material layer in the plurality of first openings;
   forming a conductive material layer that fills in the plurality of first openings on the barrier material layer; and
   removing the conductive material layer and the barrier material layer on an exterior of the plurality of first openings to form the conductive layer and the barrier layer.

10. The manufacturing method according to claim 9, wherein removing the conductive material layer and the barrier material layer on the exterior of the plurality of first openings comprises a chemical mechanical polishing process.

* * * * *